(12) United States Patent
Sung et al.

(10) Patent No.: US 6,218,876 B1
(45) Date of Patent: Apr. 17, 2001

(54) PHASE-LOCKED LOOP CIRCUITRY FOR PROGRAMMABLE LOGIC DEVICES

(75) Inventors: Chiakang Sung, Milpitas; Robert R. N. Bielby, Pleasanton; Richard G. Cliff, Milpitas; Edward Aung, Santa Clara, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/392,095

(22) Filed: Sep. 8, 1999

Related U.S. Application Data
(60) Provisional application No. 60/115,233, filed on Jan. 8, 1999.

(51) Int. Cl.[7] ................................................. H03L 7/06
(52) U.S. Cl. ............................ 327/156; 327/159; 326/93
(58) Field of Search .............................. 326/93; 327/147, 327/152, 156, 159, 292, 293, 294, 295

(56) References Cited

U.S. PATENT DOCUMENTS

| | | | |
|---|---|---|---|
| Re. 34,363 | 8/1993 | Freeman | 326/41 |
| Re. 35,797 | 5/1998 | Graham et al. | 326/40 |
| 3,473,160 | 10/1969 | Wahlstrom | 326/41 |
| 4,494,021 | 1/1985 | Bell et al. | 327/262 |
| 4,633,488 | 12/1986 | Shaw | 375/120 |
| 4,719,593 | 1/1988 | Threewitt et al. | 713/500 |
| 4,868,522 | 9/1989 | Popat et al. | 331/2 |
| 4,959,646 | 9/1990 | Podkowa et al. | 326/95 |
| 5,072,195 | 12/1991 | Graham et al. | 331/2 |
| 5,075,575 | 12/1991 | Shizukuishi et al. | 326/39 |
| 5,079,519 | 1/1992 | Ashby et al. | 331/1 |
| 5,133,064 | 7/1992 | Hotta et al. | 395/550 |
| 5,204,555 | 4/1993 | Graham et al. | 326/46 |
| 5,241,224 | 8/1993 | Pedersen et al. | 326/41 |
| 5,349,544 | 9/1994 | Wright et al. | 364/600 |
| 5,397,943 | 3/1995 | West et al. | 326/39 |
| 5,418,499 | 5/1995 | Nakao | 331/57 |
| 5,420,544 | 5/1995 | Ishibashi | 331/11 |
| 5,506,878 | 4/1996 | Chiang | 377/39 |
| 5,642,082 | 6/1997 | Jefferson | 331/25 |
| 5,646,564 | 7/1997 | Erickson et al. | 327/158 |
| 5,663,668 | * 9/1997 | Hayashi et al. | 327/156 |
| 5,689,195 | 11/1997 | Cliff et al. | 326/41 |

(List continued on next page.)

FOREIGN PATENT DOCUMENTS

| | | | |
|---|---|---|---|
| 266065 | 5/1988 | (EP) | G05B/19/04 |
| 1-137646 | 5/1989 | (JP) | H01L/21/82 |

OTHER PUBLICATIONS

"Am2971 Programmable Event Generator (PEG)", Advanced Micro Devices, Publication No. 05280, Rev. C, Amendment /0, Jul. 1986, pp. 4–286 through 4–303.

(List continued on next page.)

Primary Examiner—Tuan T. Lam
(74) Attorney, Agent, or Firm—Fish & Neave; Robert R. Jackson

(57) ABSTRACT

A programmable logic device is provided with phase-locked loop ("PLL") circuitry that includes two serially connected PLL circuits. An input clock signal is processed by a first of the PLL circuits to produce an intermediate clock signal having a frequency different from the input clock signal frequency. The intermediate clock signal is processed by the second PLL circuit to produce a final modified clock signal having a frequency different from both the input clock signal frequency and the intermediate clock signal frequency. By providing two serially connected PLL circuits, each PLL circuit can be required to operate with frequencies in a narrower range than might otherwise be required in a single PLL circuit required to produce a given input-to-final frequency change. Other circuitry on the programmable logic device (e.g., input/output registers and programmable logic circuitry for processing data signals) is responsive to the input and final modified clock signals. The two PLL circuits may alternatively be used separately or partly separately.

29 Claims, 5 Drawing Sheets

U.S. PATENT DOCUMENTS

| | | | |
|---|---|---|---|
| 5,699,020 | 12/1997 | Jefferson | 331/17 |
| 5,742,180 | 4/1998 | DeHon et al. | 326/40 |
| 5,744,991 | 4/1998 | Jefferson et al. | 327/158 |
| 5,777,360 | 7/1998 | Rostoker et al. | 257/315 |
| 5,789,952 * | 8/1998 | Yap et al. | 327/114 |
| 5,815,016 | 9/1998 | Erickson | 327/158 |
| 5,847,617 | 12/1998 | Reddy et al. | 331/57 |
| 5,909,126 | 6/1999 | Cliff et al. | 326/41 |
| 5,994,933 * | 11/1999 | Yamanaka et al. | 327/158 |

OTHER PUBLICATIONS

"AmPAL *23S8, 20–Pin IMOX PAL–Based Sequencer", Advanced Micro Devices, Publication No. 06207, Rev. B, Amendment /0, Oct. 1986, pp. 4–102 through 4–121.

Rodney Zaks and Alexander Wolfe, *From Chips to Systems: An Introduction to Microcomputers*, Prentice–Hall, Inc., Englewood Cliffs, N.J., 1987, pp. 54–61.

"Programmable Array Logic PAL20RA10–20, Advance Information", Monolitic Memories, Jan. 1988, pp. 5–95 through 5–102.

Uming Ko et al., "A 30–ps Jitter, 3.6 $\mu$s Locking, 3.3–Volt Digitial PLL for CMOS Gate Arrays", IEEE 1993 Custom Integrated Circuits Conference, May 9–12, 1993, Publication No. 0–7803–0826–3/93, pp. 23.3.1 through 23.3.4.

"Optimized Reconfigurable Cell Array (ORCA), OR3Cxxx/OR3Txxx Series Field–Programmable Gate Arrays, Preliminary Product Brief", Lucent Technologies Inc. Microelectronics Group, Allentown, PA, Nov. 1997, pp. 1–7 and unnumbered back cover.

"Using Phase Locked Loop (PLLs) in DL 6035 Devices, Application Note", DynaChip Corporation, Sunnyvale, CA, 1998, pp. i and 1–6.

"ORCA Series 3 Field–Programmable Gate Arrays, Preliminary Data Sheet, Rev. 01", Lucent Technologies Inc., Microelectronics Group, Allentown, PA, Aug. 1998, pp. 1–80.

"Virtex 2.5V Field Programmable Gate Arrays, Advanced Product Specification, Oct. 20, 1998 (Verison 1.0)", Xilinx Corporation, Oct. 20, 1998, pp. 1–24.

"Using the Virtex Delay–Locked Loop, Application Note, XAPP132 Oct. 21, 1998 (Version 1.31)", Xilinx Corporation, Oct. 21, 1998, pp. 1–14.

"DY6000 Family, FAST Field Programmable Gate Array, DY6000 Family Datasheet", DynaChip Corporation, Sunnyvale, CA Dec. 1998, pp. 1–66.

* cited by examiner

US 6,218,876 B1

PHASE-LOCKED LOOP CIRCUITRY FOR PROGRAMMABLE LOGIC DEVICES

This application claims the benefit of U.S. provisional patent application No.60/115,233, filed Jan. 8, 1999, which is hereby incorporated by reference herein in its entirety.

BACKGROUND OF THE INVENTION

This invention relates to programmable logic integrated circuit devices, and more particularly to phase-locked loop ("PLL") circuitry for programmable logic devices.

It is well known to provide PLL circuitry on programmable logic devices for such purposes as counteracting clock signal propagation delay on the device, for enabling the device to convert from one clock signal frequency (e.g., an input clock signal frequency) to another different clock signal frequency (e.g., to be output by the device), etc. Some applications of programmable logic devices may require a PLL circuit to operate with frequencies outside a range that would be expected in most cases and for which a PLL circuit is readily designed. It would therefore be desirable to have PLL circuitry for programmable logic devices that can perform tasks conventionally requiring a PLL circuit to operate with very high and/or very low frequencies without the PLL circuitry that is provided having to support such a wide range of frequencies.

In view of the foregoing, it is an object of this invention to provide improved PLL circuitry for programmable logic devices.

It is a more particular object of this invention to provide PLL circuitry for programmable logic devices that extends the PLL capabilities of the devices without the necessity for extending the operating frequency range of any part of the PLL circuitry.

SUMMARY OF THE INVENTION

These and other objects of the invention are accomplished in accordance with the principles of the invention by providing a programmable logic device with two PLL circuits that are connectable in series. Part of the signal processing required to produce a desired frequency shift can be performed by the first of the two PLL circuits, and the remainder of the required signal processing can be produced by the second PLL circuit acting on the output of the first PLL circuit. Because each PLL circuit is only required to perform part of the required signal processing, neither PLL circuit has to operate with such extreme frequencies as would be required to produce some frequency shifts if all of the frequency shift had to be produced by a single PLL stage. Connecting two PLL circuits in series on the programmable logic device makes it easier to produce more different amounts of frequency shift without needing to use extreme frequencies in any part of the PLL circuitry. The series connection between the two PLL circuits can be programmable so that either or both of those circuits can be used separately if desired. If the two PLL circuits are not used in series, the programmable connection can make the input clock signal of the first PLL circuit the input clock signal of the second PLL circuit, rather than using the output signal of the first PLL circuit as the input signal of the second PLL circuit, as is done when the first and second circuits are operated in series.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
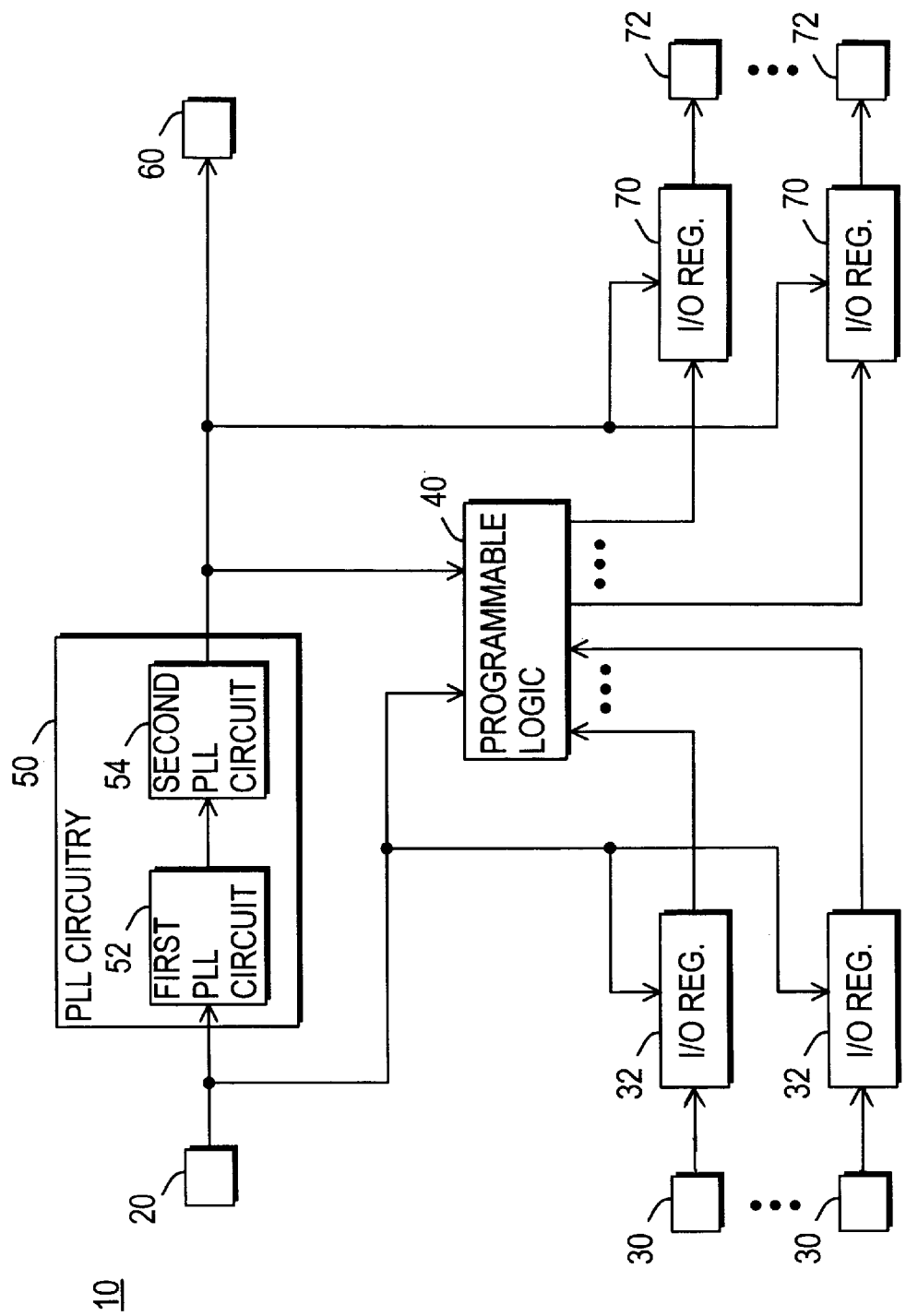
FIG. 1 is a simplified schematic block diagram of an illustrative embodiment of representative portions of a programmable logic device constructed in accordance with the invention.

As shown in FIG. 1, an illustrative programmable logic device 10 constructed in accordance with this invention has a clock signal input terminal 20 for receiving a clock signal from circuitry external to the device. Device 10 also includes a plurality of input/output ("I/O") terminals 30 for receiving data and/or control signals from external circuitry. (For convenience herein, all data and control signals other than clock signals will be referred to simply as data signals.) The data signals from terminals 30 may be applied to I/O registers 32 for temporary storage and output by those registers. The input clock signal applied to terminal 20 may be applied to I/O registers 32 to control the operation (in particular, the timing of operation) of those registers. The data signals output by registers 32 are applied to programmable logic 40 of device 10. (As an alternative to using registers 32, data from terminals 30 may be applied more directly to logic 40 (i.e., without first being registered by registers 32).) Programmable logic 40 also typically receives the input clock signal from terminal 20 and generally performs at least some operations on the input data from terminals 30 and/or registers 32 at one or more rates determined by the frequency of the clock signal from terminal 20. For example, some or all of the data applied to terminals 30 may be synchronized with the clock signal applied to terminal 20, and programmable logic 40 may partially process that data also in synchronism with the clock signal applied to terminal 20.

The input clock signal applied to terminal 20 is also applied to phase-locked loop ("PLL") circuitry 50. PLL circuitry 50 is programmed to provide a modified clock output signal which has a desired frequency relationship to the input clock signal. For example, the frequency of the modified clock output signal produced by PLL circuitry 50 may be higher or lower than the input clock signal frequency applied to terminal 20. PLL circuitry 50 includes serially connected first and second PLL circuits 52 and 54, each of which performs part of the signal processing required to produce the overall frequency shift produced by circuitry 50.

The modified clock signal produced by PLL circuitry 50 may be applied to any or all of modified clock signal output terminal 60, programmable logic 40, and I/O registers 70. Programmable logic 40 typically performs at least some data processing at one or more rates determined by the modified clock signal produced by PLL circuitry 50. For example, programmable logic 40 may perform some data processing in synchronism with the modified clock signal produced by PLL circuitry 50. Output data signals from programmable logic 40 may be applied to I/O terminals 72, possibly via I/O registers 70, which may register those data signals on their way to terminals 72 at the modified clock signal rate. Thus device 10 may output data via terminals 72 at the modified clock signal frequency and in synchronism with the modified clock signal applied to output clock terminal 60.

Although FIG. 1 may appear to show fixed interconnections among the various circuit elements, it will be understood that on a programmable logic device such as device 10 there is typically a high degree of programmability and therefore signal routing flexibility in the interconnection resources that are provided. This programmability of interconnection resources, which is well known to those in the art, is not shown in the drawings herein to avoid unnecessarily complicating the drawings. Thus not all of the interconnections shown in FIG. 1 (or in subsequently described FIG. 4) may be present in all uses of device 10 and/or other interconnections not shown in FIG. 1 (or FIG. 4) may be present in some uses of device 10. Those skilled in the art will also appreciate that the circuit elements and interconnection resources shown in FIG. 1 may be only a part of more extensive circuit element and interconnection resources provided on device 10. Examples of programmable logic devices in which the present invention can be implemented will be found in Cliff et al. U.S. Pat. No. 5,689,195, Cliff et al. U.S. Pat. No. 5,909,126, and Jefferson et al. U.S. patent application Ser. No. 09/266,235, filed Mar. 10, 1999, all of which are hereby incorporated by reference herein in their entireties.

Figure 2:
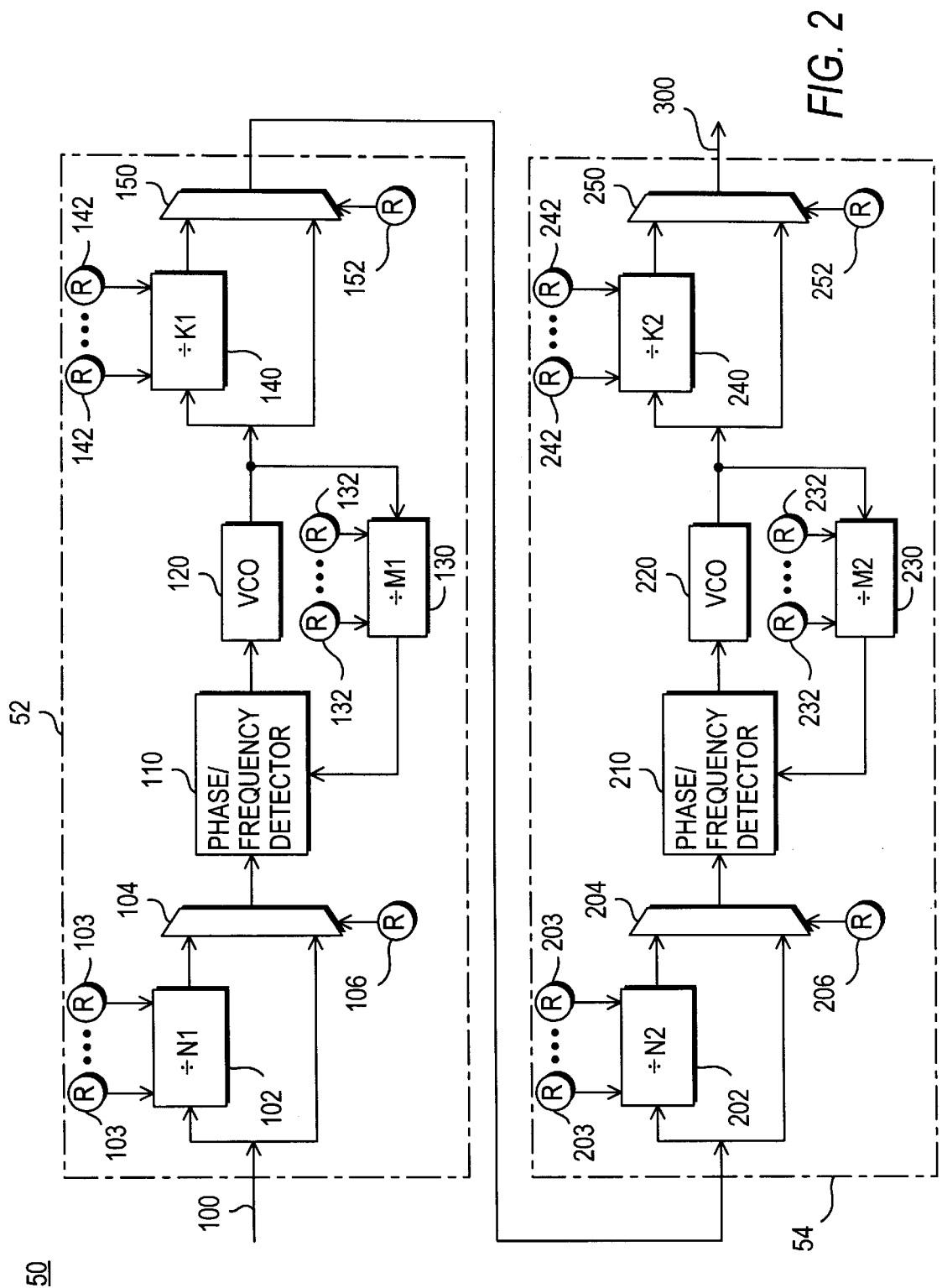
FIG. 2 is a more detailed, but still simplified, schematic block diagram of an illustrative embodiment of a portion of the circuitry shown in FIG. 1.

An illustrative construction of PLL circuitry 50 is shown in more detail in FIG. 2. As has been mentioned, PLL circuitry 50 includes first PLL circuit 52 connected in series with second PLL circuit 54. First PLL circuit 52 receives a clock input signal (e.g., from terminal 20 in FIG. 1) via lead 100. The signal on lead 100 is applied to prescale frequency divider circuitry 102 and to one input terminal of programmable logic connector ("PLC") circuitry 104 (e.g., a multiplexer). Divider circuitry 102 divides the frequency of the applied clock signal by a factor N1, which is preferably a programmable parameter of device 10 stored in programmable function control elements ("FCEs") 103. The output signal of divider circuitry 102 is applied to a second input terminal of PLC 104. PLC 104 is programmably controlled by FCE 106 to select one of its two input signals to be its output signal that is applied as a driving clock signal to one input terminal of phase/frequency detector ("PFD") circuitry 110.

Figure 3:
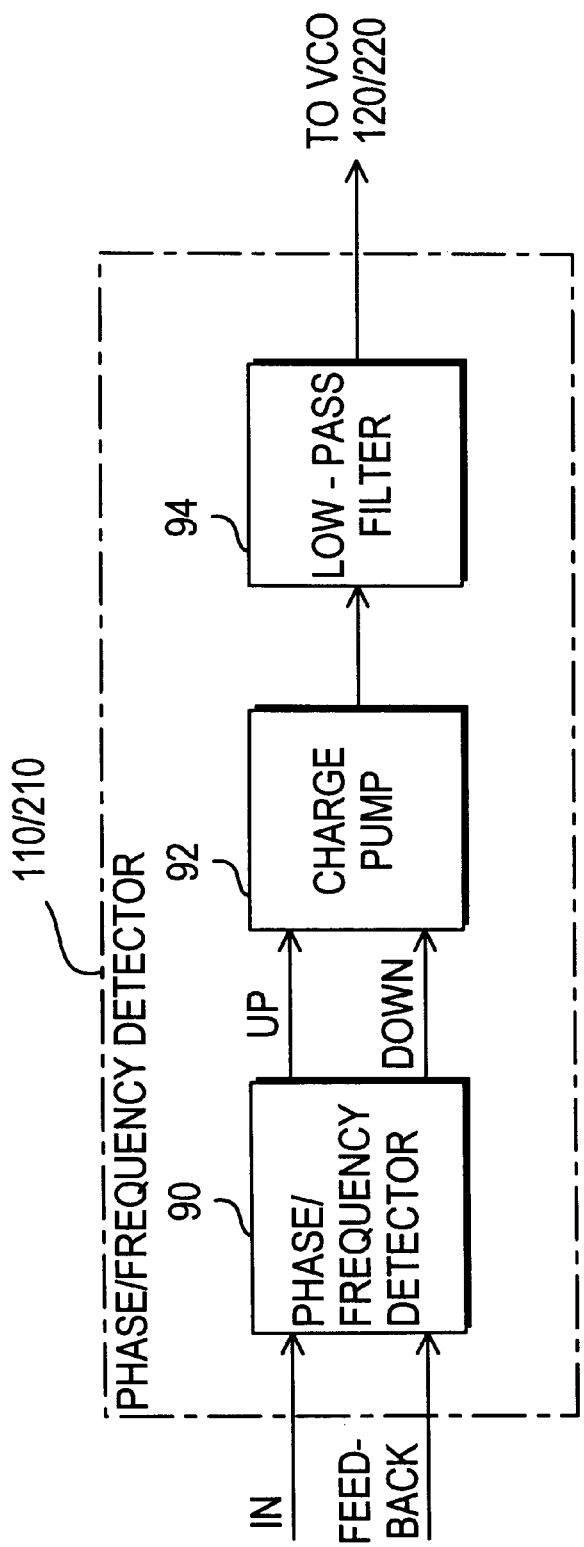
FIG. 3 is a more detailed, but still simplified, block diagram of a typical construction of portions of the FIG. 2 circuitry.

PFD 110, which can be conventional, also receives the output signal of feedback frequency divider circuitry 130. PFD 110 produces an output signal which is indicative of the phase/frequency difference between the two signals that are applied to it. (FIG. 2 simplifies the depiction of PLL circuit 52 (and PLL circuit 54) by combining several circuit elements in the blocks labeled "phase/frequency detector." A more complete depiction of the circuitry represented by these FIG. 2 blocks is shown in FIG. 3 and described later in this specification. The simpler depiction shown in FIG. 2 is, however, adequate for understanding the present invention.) The output signal of PFD 110 is applied as a control signal to voltage controlled oscillator ("VCO") circuitry 120, which can again be conventional. The output signal of VCO 120 is applied to feedback frequency divider circuitry 130, to post-scale frequency divider circuitry 140, and to one input terminal of PLC 150. Divider circuitry 130 divides the frequency of the signal applied to it by factor M1 in order to produce the above-mentioned second (feedback) input to PFD 110. Divider circuitry 140 divides the frequency of the signal applied to it by factor K1 and applies the resulting signal to a second input terminal of PLC 150. PLC 150 is programmably controlled by FCE 152 to output either one of its two inputs as an intermediate clock signal applied to PLL circuit 54. Factors K1 and M1 are preferably programmable parameters of device 10 stored, respectively, in FCEs 142 and 132.

As has been mentioned, the output signal of PLC 150 is applied to PLL circuit 54. The construction of PLL circuit 54 is similar to the above-described construction of circuit 52. Accordingly, it will not be necessary to describe circuit 54 in the same detail that circuit 52 has been described. Elements in circuit 54 that are similar to elements in circuit 52 have reference numbers in circuit 54 that are increased by 100 relative to the reference numbers of the corresponding elements in circuit 52. The scale factors of divider circuits 202, 230, and 240 are referred to as N2, M2, and K2 to distinguish them from factors N1, M1, and K1 in circuit 52. Like factors N1, M1, and K1, factors N2, M2, and K2 are preferably programmable parameters of device 10. Each of these circuit 54 factors can be the same as or different from the corresponding circuit 52 factor. The output signal of PLC 250 on lead 300 is the final output signal of PLL circuitry 50. In FIG. 1 this is the modified clock signal applied, for example, to modified clock signal output terminal 60.

Each of PLL circuits 52 and 54 can be used to produce an output signal having a frequency that is different from the frequency of the signal applied to it. The frequency shift or change produced is determined by the values of factors N, M, and K in that circuit. For example, the effect of factor N in each PLL circuit is to divide the input frequency by N, assuming that the associated PLC 104/204 is programmed to make use of the output signal of divider 102/202 rather than to merely bypass it. The effect of factor M in each PLL circuit is to cause elements 110/120 or 210/220 to cooperate to multiply by M the frequency of the signal output by the associated PLC 104/204. In other words, the frequency of the output signal of VCO 120/220 is forced to be M1 or M2 times the frequency of the output signal of the associated PLC 104/204. The effect of factor K in each PLL circuit is to divide the frequency of the applied VCO output signal by K, again assuming that the associated PLC 150/250 is programmed to make use of the output signal of divider 140/240 rather than to merely bypass it. Each of factors N, M, and K in each of circuits 52 and 54 is programmable (by programming the associated FCEs) to have any of a range of different values. The following example illustrates the foregoing operating principles, as well as demonstrating the need for the present invention.

Assume that it is desired to use device 10 to convert signals from the conventional "T1" telecommunications data rate to the conventional "E1" telecommunications data rate. T1 operates at 1.544 MHZ; E1 operates at 2.048 MHZ. To produce an E1 clock signal from a T1 clock signal requires the T1 clock signal frequency to be multiplied by 256, and the resulting product to be divided by 193 (or alternatively to divide the T1 clock signal frequency by 193 and multiply the resulting quotient by 256). If only a single PLL circuit like 52 or 54 is available to perform this frequency conversion, either of two approaches can be taken. The first approach is to use the first "divide by N prescale" (in a divider circuit like 102 or 202 in FIG. 2) to divide the incoming T1 clock signal frequency by 193. Then the "divide by M feedback-scale" (in a divider circuit like 130 or 230 in FIG. 2) is used to force the PFD and VCO to multiply the signal frequency from the prescale by 256. The "divide by K post-scale" (in a divider circuit like 140 or 240 in FIG. 2) is bypassed. A possible problem with his approach is that the PFD is receiving an 8 KHz signal from the prescale (because 1.544 MHZ÷193=8 Hz). 8 KHz is a relatively low frequency that may be below the minimum acceptable input frequency for the PFD.

The second approach is to bypass the "divide by N prescale" and use the "divide by M feedback-scale" (in a divider circuit like 130 or 230 in FIG. 2) to force the PFD and VCO to multiply the incoming T1 clock signal frequency by 256. This produces a VCO output signal having a frequency of approximately 395 MHZ. The "divide by K post-scale" (in a divider circuit like 140 or 240 in FIG. 2) is then used to divide the VCO output signal frequency by 193. A possible problem with this approach is that 395 MHZ is a relatively high frequency that may exceed the maximum acceptable VCO output signal frequency. Thus conversion from T1 to E1 is an example of a task that it may be difficult or impossible to do on a programmable logic device with only a single PLL circuit available.

It will now be shown how the foregoing problems associated with converting from T1 to E1 frequencies can be solved in accordance with this invention. Using the circuitry shown in FIG. 2, the following scale factor values are employed:

N1: 1 or bypassed;
M1: 128;
K1: 193;
N2: 1 or bypassed;
M2: 2;
K2: 1 or bypassed.

With these scale factor values, the frequency of the output signal of VCO 120 is only approximately 197 MHZ. This is much more likely to be an acceptable VCO output signal frequency than 395 MHZ. The frequency of the intermediate clock signal applied to PLL circuit 54 is 1.028 MHZ, which is more likely to be an acceptable PFD input signal frequency than 8 KHz.

The foregoing example illustrates how, by breaking the task of producing a frequency change into two parts, the range of frequencies that must be worked with in each part can be narrowed. Because the difficulty of designing a PLL circuit tends to increase as the range of frequencies that the circuit must work with increases, narrowing that range simplifies the PLL circuit design.

In respects other than those shown in FIGS. 1 and 2, programmable logic device 10 may be constructed in any of many different ways. Particularly preferred constructions for device 10 are shown in Jefferson et al. U.S. patent application Ser. No. 09/266,235, filed Mar. 10, 1999, which is hereby incorporated by reference herein in its entirety. Other examples of suitable programmable logic device constructions will be found in Freeman U.S. Pat. No. Re. 34,363, Pedersen et al. U.S. pat. No. 5,241,224, Cliff et al. U.S. Pat. No. 5,689,195, Cliff et al U.S. Pat. No. 5,909,126, and Cliff et al. U.S. Pat. No. 5,963,049, all of which are hereby incorporated by reference herein in their entireties.

Although terminals like 30 and 72 are generally referred to herein as I/O terminals, it will be understood that such terminals can alternatively be input-only or output-only, and that the term "I/O terminal" is used herein as a generic term for all of these types of terminals including true input/output terminals.

As was mentioned earlier, a more detailed depiction of the typical construction of each PFD 110 or 210 in FIG. 2 is shown in FIG. 3. Thus each PFD 110 or 210 typically includes a phase/frequency detector circuit 90 which receives the input and feedback clock signals and produces "up" or "down" output signal pulses applied to charge pump circuit 92 depending on whether the phase of the input clock signal leads or lags the phase of the feedback clock signal. The width of the "up" or "down" signal pulses is typically controlled by element 90 to be proportional to the phase difference between the input and feedback clock signals. Charge pump circuit 92 provides a transfer function of the "up" and "down" signals to an output signal voltage at a level between VCC (the power supply voltage of device 10) and ground. The "up" and "down" signals switch an internal current source to deliver a charge to move the charge pump output signal voltage up or down during each clock cycle. The output signal of charge pump circuit 92 is applied to low-pass filter circuit 94, which smoothes the signal for application as a control signal to the associated VCO 120 or 220. In sum, when the phase of the input clock signal leads the phase of the feedback clock signal, an "up" signal is generated by element 90. This results in an increase in the frequency of the feedback clock signal. Conversely, when the phase of the input clock signal lags the phase of the feedback clock signal, element 90 produces a "down" signal, which causes a decrease in the frequency of the feedback clock signal.

Figure 4:
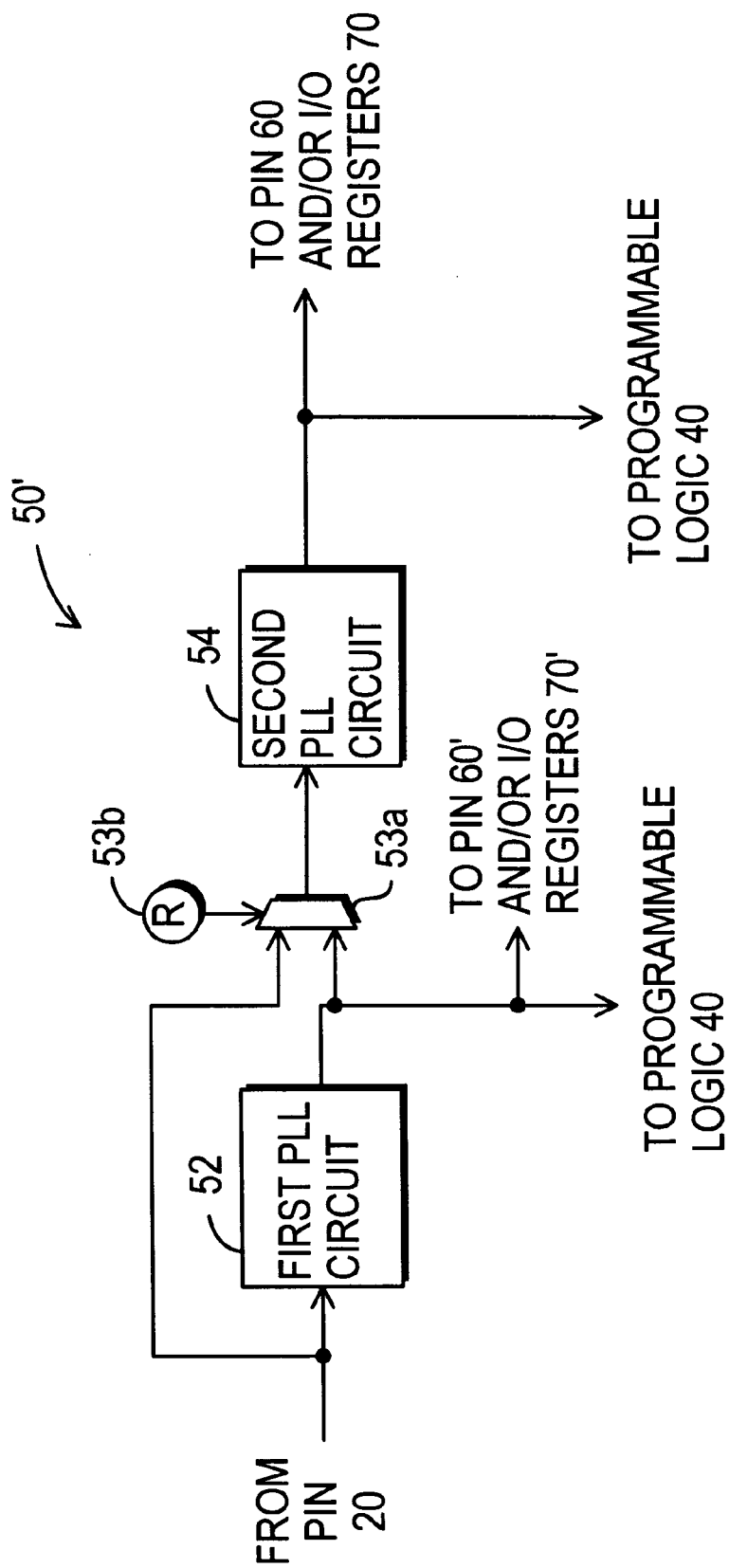
FIG. 4 is a simplified schematic block diagram showing an alternative embodiment of a portion of the FIG. 1 circuitry in accordance with the invention.

The detailed description thus far assumes that first and second PLL circuits 52 and 54 are always used together in series. FIG. 4 shows a modified or alternative embodiment 50' in which either or both of circuits 52 and 54 can be used separately, or in which both circuits can be used together (as in FIGS. 1 and 2). In the embodiment shown in FIG. 4 the output signal of first PLL circuit 52 is connected to one input terminal of PLC 53*a*, and can also be applied to any or all of programmable logic 40, output pin 60' (similar to pin 60 in FIG. 1), and one or more I/O registers 70' (similar to I/O registers 70 in FIG. 1). In addition to being applied to first PLL circuit 52, the input clock signal from pin 20 is applied to the second input terminal of PLC 53*a*. PLC 53*a* is programmable (by programming FCE 53*b*) to apply either one of its inputs to second PLL circuit 54. As in FIG. 1, the output signal of second PLL circuit 54 is applied to any or all of programmable logic 40, output pin 60, and I/O registers 70.

If PLC 53*a* is programmed to apply the input clock signal from pin 20 to second PLL circuit 54, then either or both of circuits 52 and 54 can be used separately to operate on the input clock signal in order to produce output clock signals with different frequencies. Using the same PLL circuit scale factors that are shown in FIG. 2, first PLL circuit 52 produces an output signal having a frequency Fout that is related to the frequency Fin of the input clock signal from pin 20 by the equation Fout=Fin*M1/N1/K1. Assuming that PLC 53*a* is programmed to apply the same pin 20 input clock signal to second PLL circuit 54, then Fout for circuit 54 is given by the equation Fout=Fin*M2/N2/K2. If M1/N1/K1 has a value different from M2/N2/K2, first and second PLL circuits 52 and 54 produce output signals having different frequencies. Different parts of programmable logic 40 can use these two different signal frequencies to process data at different rates. Similarly, I/O registers 70 and 70' can be clocked by these two different signals at different rates. And pins 60 and 60' can output these two different signals as output clock signals having different frequencies.

Alternatively, if PLC 53*a* is programmed to apply the output signal of first PLL circuit 52 to the input of second PLL circuit 54, the overall frequency shift produced by serially connected circuits 52 and 54 is given by the equation Fout=Fin*M1*M2/N1/N2/K1/K2, where Fin is again the frequency of the input clock signal from pin 20 and Fout is the frequency of the output signal of second PLL circuit 54 applied to any or all of elements 40, 60, and 70. Even if circuits 52 and 54 are connected in series as has just been described, the output signal of first PLL circuit 52 is additionally available as a signal having a different frequency Fout=Fin*M1/N1/K1 for application to any or all of elements 40, 60', and 70'.

Figure 5:
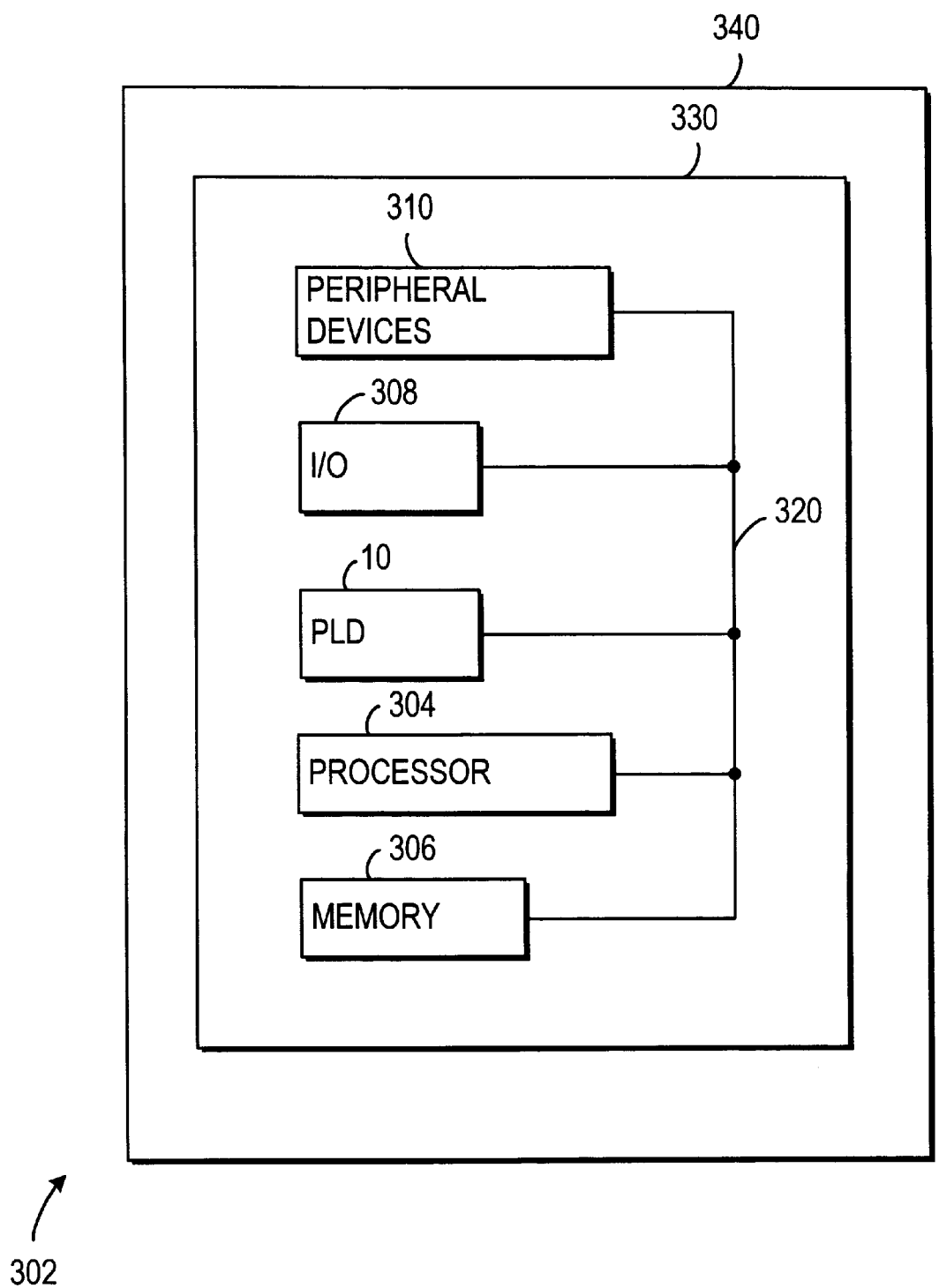
FIG. 5 is a simplified block diagram of an illustrative system employing a programmable logic device having PLL circuitry in accordance with the invention.

FIG. 5 illustrates a programmable logic device 10 of this invention in a data processing system 302. Data processing system 302 may include one or more of the following components: a processor 304; memory 306; I/O circuitry 308; and peripheral devices 310. These components are coupled together by a system bus 320 and are populated on a circuit board 330 which is contained in an end-user system 340.

System 302 can be used in a wide variety of applications, such as computer networking, data 30 networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 304. Programmable logic device 10 may also be used as an arbiter for arbitrating access to a shared resource in system 302. In yet another example, programmable logic device 10 can be configured as an interface between processor 304 and one of the other components in system 302. It should be noted that system 302 is only exemplary, and that the true scope and spirit of the invention should be indicated by the following claims.

Various technologies can be used to implement programmable logic devices 10 having the PLL circuitry of this invention, as well as the various components of those devices (e.g., the above-described PLCs and the FCEs that control the PLCs and divider circuits). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs and the divider circuits can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferroelectric memories, fuses, antifuses, or the like. The FCEs that control the PLCs and divider circuits in FIGS. 2 and 4 are preferably programmed in the same way and at the same time that programmable logic 40 in FIG. 1 is programmed. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, PLL circuitry 50 or 50' similar to that shown and described herein can be provided for each of any number of clock input terminals (like terminal 20) on a programmable logic device.

What is claimed is:

1. A programmable logic device comprising:
    a clock signal input terminal configured to receive from circuitry external to the device an input clock signal having a first frequency;
    a plurality of data signal input terminals configured to receive from circuitry external to the device a plurality of input data signals;
    a plurality of data signal output terminals configured to convey a plurality of output data signals from the device to circuitry external to the device;
    phase-locked loop circuitry configured to respond to the input clock signal by producing a modified clock signal having a second frequency which is different from the first frequency; and
    programmable logic circuitry configured to respond to the input clock signal, the modified clock signal, and the input data signals by producing the output data signals, wherein the phase-locked loop circuitry comprises:
        a first phase-locked loop circuit configured to respond to the input clock signal by producing an intermediate clock signal having a third frequency which is different from the first and second frequencies; and
        a second phase-locked loop circuit configured to respond to the intermediate clock signal by producing the modified clock signal.

2. The device defined in claim 1 further comprising:
    a clock signal output terminal configured to convey the modified clock signal to circuitry external to the device.

3. The device defined in claim 1 further comprising:
    a plurality of registers configured to respond to the input clock signal by registering the input data signals.

4. The device defined in claim 1 further comprising:
    a plurality of registers configured to respond to the modified clock signal by registering the output data signals.

5. The device defined in claim 1 wherein the programmable logic circuitry is further configured to process some of the input data signals in synchronism with the input clock signal, and to produce some of the output data signals in synchronism with the modified clock signal.

6. The device defined in claim 1 wherein the first phase-locked loop circuit comprises:
    phase/frequency detector circuitry configured to receive a driving clock signal and a feedback clock signal and to produce an output signal indicative of a phase/frequency difference between the driving and feedback clock signals;
    voltage controlled oscillator circuitry configured to produce a VCO output clock signal having a frequency which is a function of the phase/frequency detector output signal; and
    feedback frequency divider circuitry configured to produce the feedback clock signal by dividing the frequency of the VCO output clock signal by a feedback factor.

7. The device defined in claim 6 wherein the feedback factor is programmable to have any of a plurality of different values.

8. The device defined in claim 6 wherein the first phase-locked loop circuit further comprises:

prescale frequency divider circuitry configured to produce the driving clock signal by dividing the input clock signal frequency by a prescale factor.

9. The device defined in claim 8 wherein the prescale factor is programmable to have any of a plurality of different values.

10. The device defined in claim 6 wherein the first phase-locked loop circuit further comprises:

post-scale frequency divider circuitry configured to produce a PLL circuit output clock signal by dividing the frequency of the VCO output clock signal by a post-scale factor.

11. The device defined in claim 10 wherein the post-scale factor is programmable to have any of a plurality of different values.

12. The device defined in claim 8 wherein the first phase-locked loop circuit further comprises:

programmable logic connector circuitry configured to programmably select either the input clock signal or the clock signal produced by the prescale frequency divider circuitry as the driving clock signal.

13. The device defined in claim 10 wherein the first phase-locked loop circuit further comprises;

programmable logic connector circuitry configured to programmably select either the VCO output clock signal or the clock signal produced by the post-scale frequency divider circuitry as the intermediate output clock signal.

14. The device defined in claim 1 wherein the programmable logic circuitry is additionally configured to respond to the intermediate clock signal.

15. The device defined in claim 1 further comprising:

a clock signal output terminal configured to convey the intermediate clock signal to circuitry external to the device.

16. The device defined in claim 1 further comprising:

a plurality of registers configured to respond to the intermediate clock signal by registering the output data signals.

17. The device defined in claim 1 further comprising:

programmable logic connector circuitry configured to programmably selectively substitute the input clock signal for the intermediate clock signal as the signal to which the second phase-locked loop circuit responds to produce the modified clock signal.

18. A digital processing system comprising:

processing circuitry;

a memory coupled to said processing circuitry; and a programmable logic device as defined in claim 1 coupled to the processing circuitry and the memory.

19. A printed circuit board on which is mounted a programmable logic device as defined in claim 1.

20. The printed circuit board defined in claim 19 further comprising:

a memory mounted on the printed circuit board and coupled to the programble logic device.

21. The printed circuit board defined in claim 19 further comprising:

processing circuitry mounted on the printed circuit board and coupled to the programable logic device.

22. The device defined in claim 1 wherein the second phase-locked loop circuit comprises:

phase/frequency detector circuitry configured to receive a driving clock signal and a feedback clock signal and to produce an output signal indicative of a phase/frequency difference between the driving and feedback clock signals;

voltage controlled oscillator circuitry configured to produce a VCO output clock signal having a frequency which is a function of the phase/frequency detector output signal; and feedback frequency divider circuitry configured to produce the feedback clock signal by dividing the frequency of the VCO output clock signal by a feedback factor.

23. The device defined in claim 22 wherein the feedback factor is programmable to hate any of a plurality of different values.

24. The device defined in claim 22 wherein the second phase-locked loop circuit further comprises:

prescale frequency divider circuitry configured to produce the driving clock signal by dividing the intermediate clock signal frequency by a prescale factor.

25. The device defined in claim 24 wherein the prescale factor is programmable to have any of a plurality of different values.

26. The device defined in claim 22 wherein the second phase-locked loop circuit further comprises:

post-scale frequency divider circuitry configured to produce a PLL circuit output clock signal by dividing the frequency of the VCO output clock signal by a post-scale factor.

27. The device defined in claim 26 wherein the post-scale factor is programmable to have any of a plurality of different values.

28. The device defined in claim 24 wherein the second phase-locked loop circuit further comprises:

programmable logic connector circuitry configured to programmably select either the intermediate clock signal or the clock signal produced by the prescale frequency divider circuitry as the driving clock signal.

29. The device defined in claim 26 wherein the second phase-locked loop circuit further comprises:

programmable logic connector circuitry configured to programmably select either the VCO output clock signal or the clock signal produced by the post-scale frequency divider circuitry as the modified clock signal.

* * * * *